United States Patent [19]

McElroy

[11] Patent Number: 4,608,751
[45] Date of Patent: Sep. 2, 1986

[54] METHOD OF MAKING DYNAMIC MEMORY ARRAY

[75] Inventor: David J. McElroy, Houston, Tex.

[73] Assignee: Texas Instruments Incorporated, Dallas, Tex.

[21] Appl. No.: 638,442

[22] Filed: Aug. 7, 1984

Related U.S. Application Data

[60] Continuation of Ser. No. 399,038, Jul. 16, 1982, which is a division of Ser. No. 137,705, Apr. 7, 1980, Pat. No. 4,345,364.

[51] Int. Cl.$^4$ ................ H01L 27/04; H01L 29/78
[52] U.S. Cl. ................ 29/576 B; 365/149; 29/577 C
[58] Field of Search ........ 365/149; 357/24; 29/571, 576 B, 577 C

[56] References Cited

U.S. PATENT DOCUMENTS

| | | | |
|---|---|---|---|
| 3,387,286 | 6/1968 | Dennard | 357/24 |
| 3,740,731 | 6/1973 | Ohwada et al. | 365/149 |
| 3,874,955 | 4/1975 | Arita | 29/571 |
| 4,075,045 | 2/1978 | Rideout | 29/571 |
| 4,125,933 | 11/1978 | Baldwin et al. | 29/571 |
| 4,240,092 | 12/1980 | Kuo | 357/41 |
| 4,290,186 | 9/1981 | Klein et al. | 29/576 B |
| 4,295,264 | 10/1981 | Rogers | 29/571 |

OTHER PUBLICATIONS

IBM Tech. Dis. Bul., vol. 19, No. 2, Jul. 1976, pp. 458–459, "One-Device Storage Cell with Implanted Storage Node".
IBM Tech. Dis. Bul., vol. 14, No. 11, Apr. 1972, pp. 3359–3360, "One Device Memory Cell with Step Oxide Structure".
IBM Tech. Dis. Bul., vol. 18, No. 10, Mar. 1976, p. 3288, "Memory Cell Structure".

Primary Examiner—Terrell W. Fears
Attorney, Agent, or Firm—John G. Graham

[57] ABSTRACT

A dynamic read/write memory cell of the one transistor type is made by a single-level polysilicon process in which the word lines and the gates of the access transistors are formed by the metal strips. No metal-to-silicon or metal-to-polysilicon contacts are needed. The access transistors are made by etching through polysilicon strips which are the capacitor bias plates. The size of the transistor is not determined by alignment accuracy.

11 Claims, 9 Drawing Figures

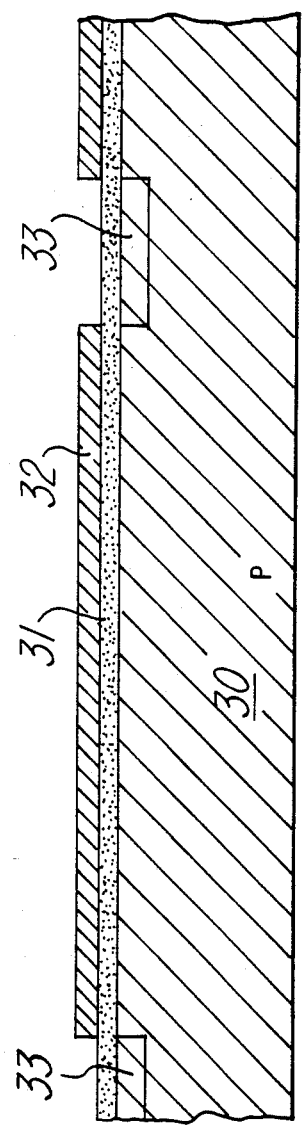
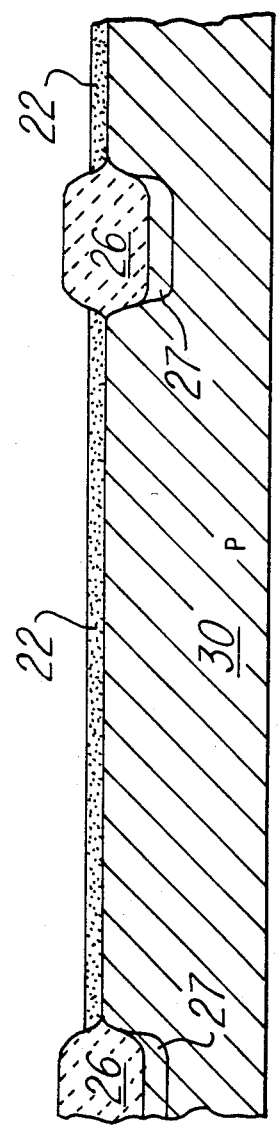
Fig. 4a
Fig. 4b

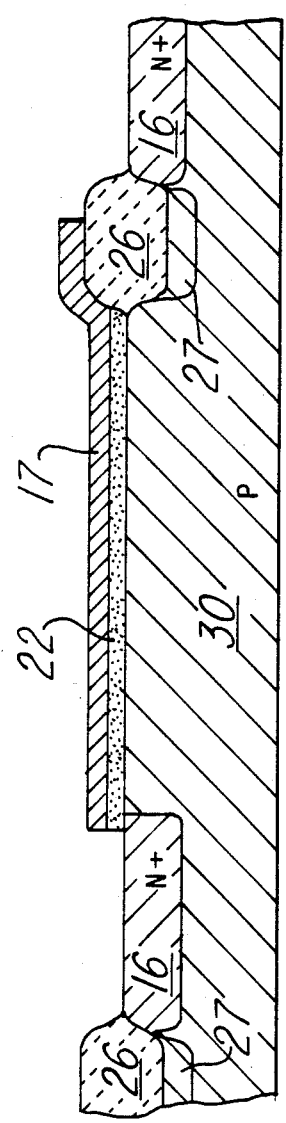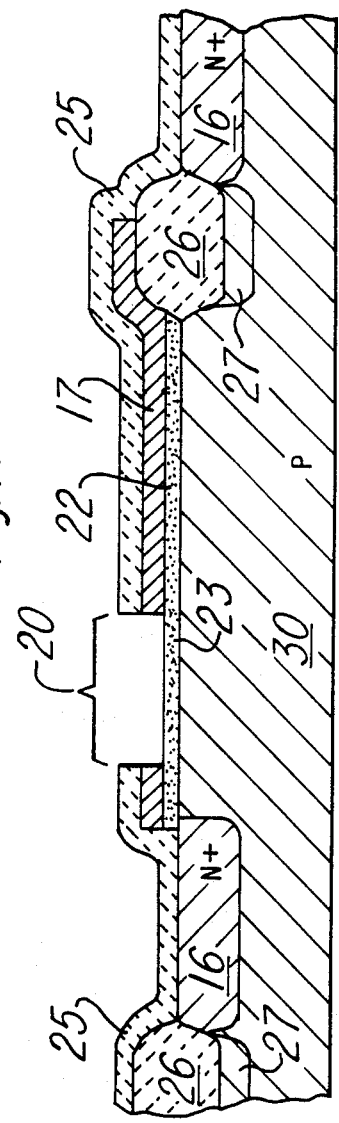

METHOD OF MAKING DYNAMIC MEMORY ARRAY

This is a continuation of application Ser. No. 399,038, filed July 16, 1982, which was a division of Ser. No. 137,705 filed Apr. 7, 1980, now U.S. Pat. No. 4,345,364.

BACKGROUND OF THE INVENTION

This invention relates to semiconductor memory devices and method of manufacture, and more particularly to a one-transistor dynamic read/write memory cell array.

Dynamic read/write memory cells made by the double-level polysilicon N-channel self-aligned process commonly used in the industry are shown in pending U.S. Pat. no. 4,240,092, by C-K Kuo, assigned to Texas Instruments, as well as in Electronics, Feb. 19, 1976, pp. 116-121, May 13, 1976, pp. 81-86, and Sept. 28, 1978, pp. 109-116.

Although the double-level polysilicon process has proved to be quite successful and many hundreds of millions of memory devices have been made in this way, there is nevertheless added cost and degradation in yield due to the additional process steps compared to a single level process. Further, the classic cell layout uses a transistor which has a channel length determined by the amount of overlap of the two poly levels, making the characteristics of the transistor difficult to control. Another problem is the necessity of making metal-to-polysilicon contacts to connect the row lines to the gate.

It is the principal object of this invention to provide an improved dynamic read/write memory cell. Another object is to provide a dynamic memory of small cell size. An additional object is to provide a dense array of dynamic memory cells, made by a more efficient method. A further object is to provide an improved way of making dynamic memory cells without using metal-to-polysilicon contacts in the array. Another object is to avoid relying upon allignment precision in defining transistor channel lengths in dynamic memory cells.

SUMMARY OF THE INVENTION

In accordance with an illustrative embodiment of the invention a dynamic read/write memory cell of the one transistor type is made by a single-level polysilicon process in which the word lines and the gates of the access transistors are formed by metal strips. No metal-to-silicon or metal-to-polysilicon contacts are needed. The access transistors are made by etching through polysilicon strips which are the capacitor bias plates. The size of the transistor is not determined by allignment accuracy.

BRIEF DESCRIPTION OF THE DRAWINGS

The novel features believed characteristic of the invention are set forth in the appended claims. The invention itself, however, as well as other features and advantages thereof, will be best understood by reference to the detailed description wherein:

FIGS. 2 through 4d, inclusive, of my U.S. Pat. No. 4,345,364 are incorporated herein by reference.

DETAILED DESCRIPTION OF SPECIFIC EMBODIMENT

Figure 1:
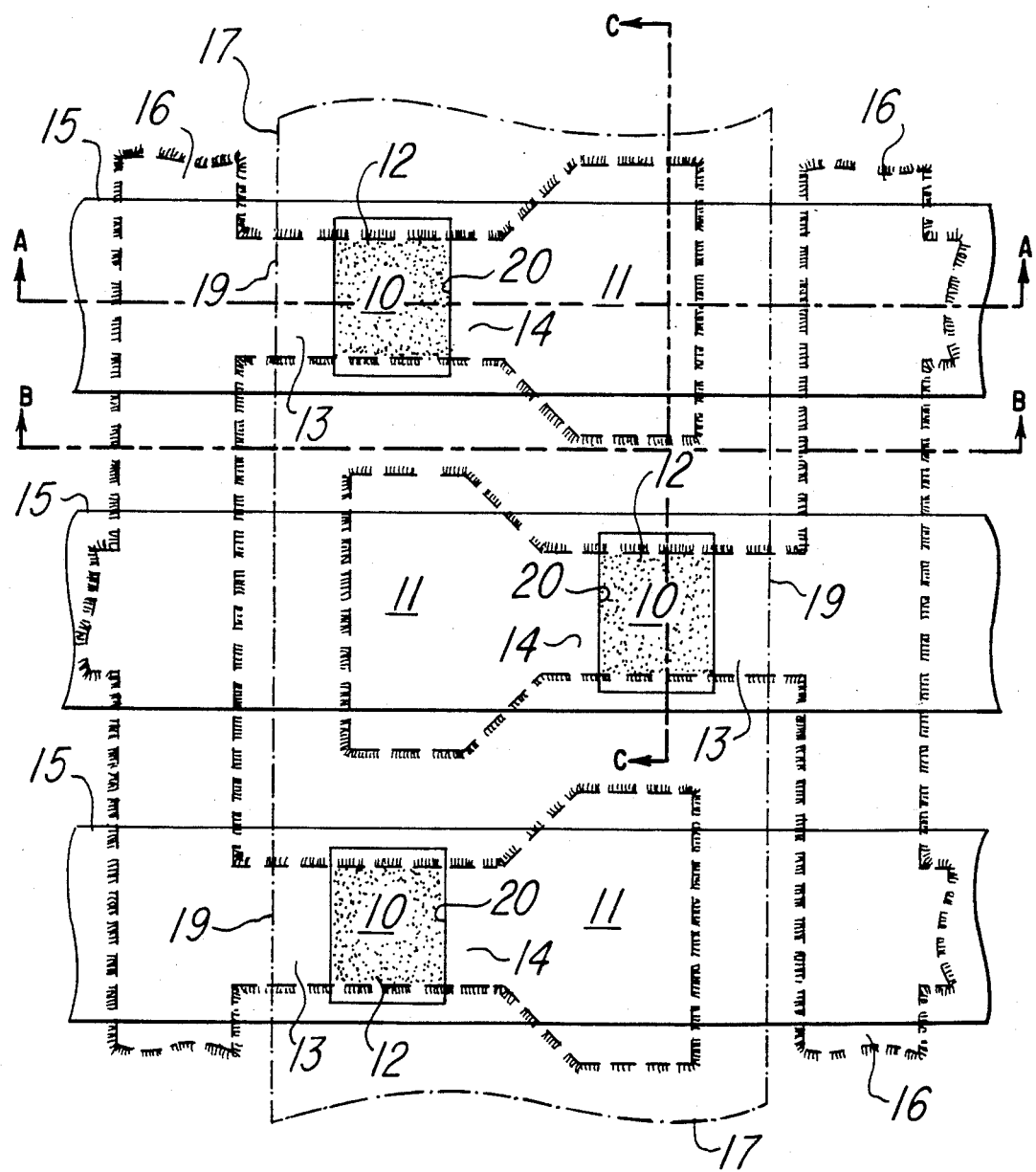
FIG. 1 is a greatly enlarged plan view of a small portion of a semiconductor chip showing the physical layout of a part of a dynamic memory cell array employing cells made according to the invention.
Figure 2:
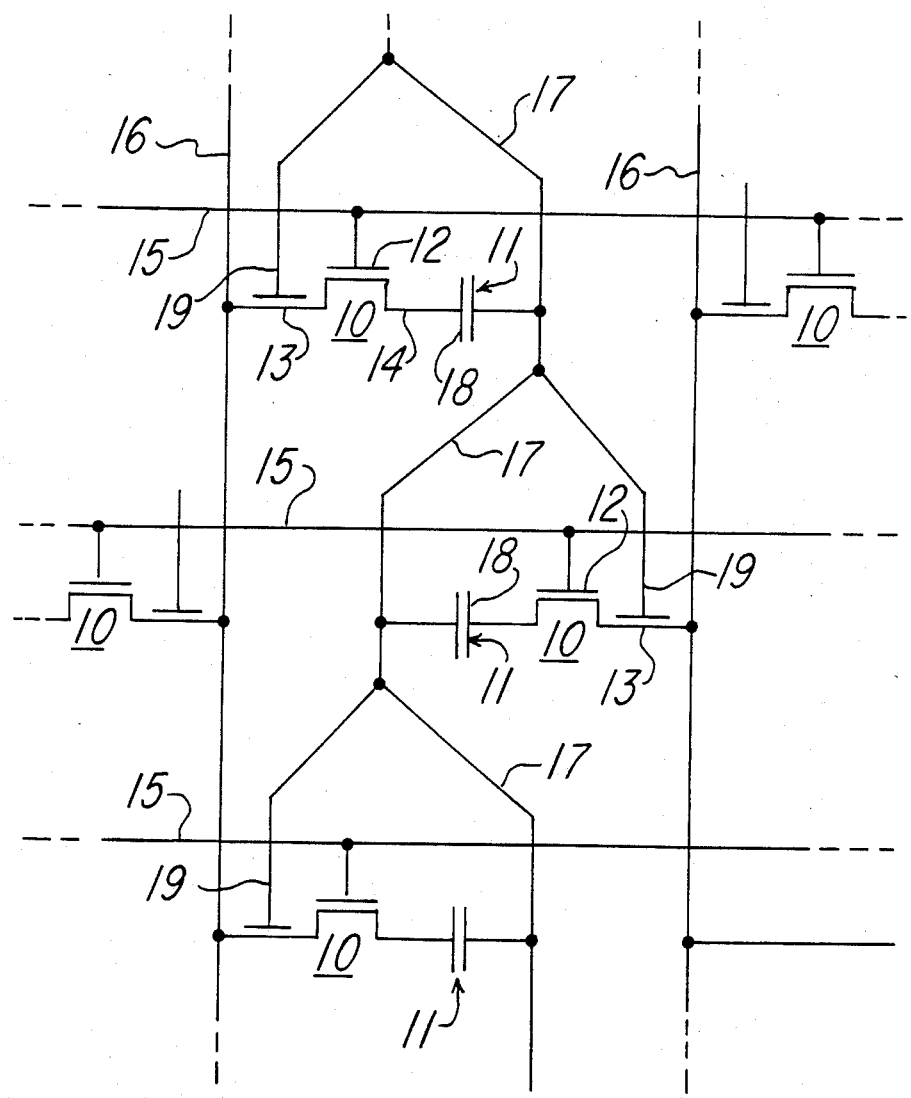
Figure 3A:
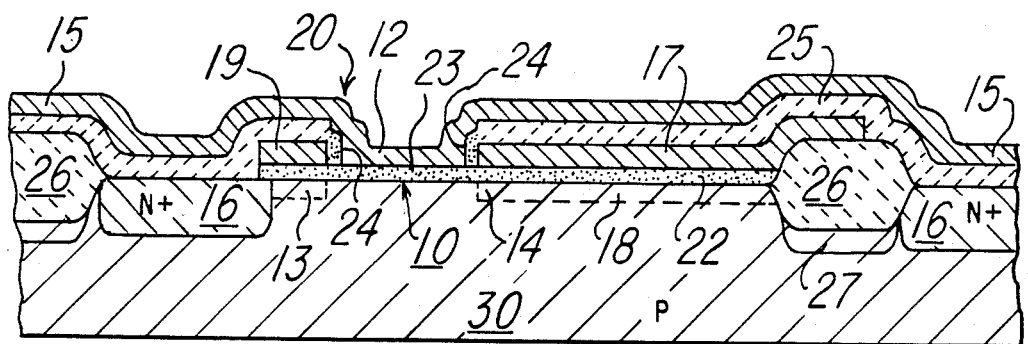
Figure 3B:
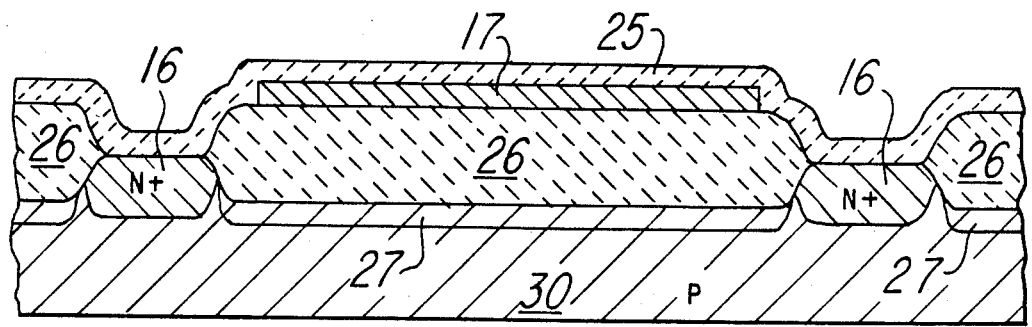
Figure 3C:
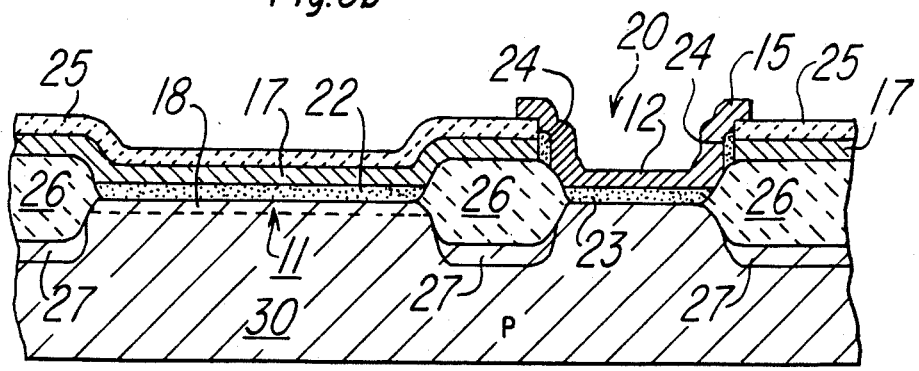

With reference to FIG. 1 and to FIGS. 2 and 3A-3e of U.S. Pat. No. 4,345,364, a one-transistor dynamic memory cell is illustrated which is made according to the invention. The array consists of a large number of cells, each with an access transistor 10 and a capacitor 11. The access transistor 10 has a gate 12, a source 13 and a drain 14. The gates 12 are parts of elongated metal strips 15 which are the X or word address lines for the array. The sources 13 are inverted surface regions connected to N+ diffused moat regions 16 which are the bit lines or Y output lines. The capacitors 11 include a first level polysilicon bias gate 17 which is part of an elongated strip of polysilicon extending along the entire array and connected to the Vcc supply, ordinarily +5V. The lower plates of the capacitors 11 are created by inverted regions 18 beneath the gates 17. The source region 13 is also inverted by the voltage on the segment 19 of the strip 17. The transistors 10 are formed in holes 20 in the strip 17.

A thin gate oxide layer 22 separates the first level polysilicon bias strip 17 from the silicon surface, and thin gate oxide layer 23 separates the metal gate 12 from the silicon; an oxide coating 24 separates the metal line 15 from the poly 17 and 19 in each cell. A thick layer 215 of low temperature deposited oxide overlies the upper surface of the bar. A thick thermal field oxide coating 26 covers parts of the bar not occupied by the transistors or diffused interconnects (moat regions), and P+ channel stop regions 27 are formed underneath all the thick field oxide.

The array is formed on a silicon bar 30 which would typically contain perhaps 64K or 256K bits on a bar less than 200 mils on a side or 40,000 square mil area, depending upon the bit density. The three cells shown would be on a minute part of the bar perhaps about one mil wide. A 64K cell array would require 256 of the metal X address lines 15 and 256 of the N+ diffused Y lines 16, providing 65,536 bits.

In FIGS. 4a-4d of my U.S. Pat. No. 4,345,364, incorporated herein by reference, a process for making the cell array according to the invention is described.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making a plurality of dynamic semiconductor memory cells of the one-transistor type at a face of a semiconductor body, comprising the steps of:
    applying a layer of conductive material on said face overlying and separated from a plurality of cell areas by insulator, each cell area including a transistor area and a capacitor area,
    opening a plurality of windows in said layer, each window being over one of said transistor areas,
    applying a plurality of conductive strips on said face over said layer but insulated therefrom, said strips extending into said windows to form gates of transistors at said transistor areas.

2. A method according to claim 1 wherein the semiconductor body is P-type silicon and the conductive material is polycrystalline silicon.

3. A method according to claim 2 wherein said layer is patterned to define a bias gate for a capacitor which will partially underlie the conductive strips.

4. A method according to claim 3 wherein said conductive strips are metal and said coating separates said metal from said face except at said windows where a thin gate oxide underlies the metal.

5. A method according to claim 4 wherein a coating of chick thermal field oxide is formed on said face before applying said layer, except in the capacitor and transistor areas.

6. A method according to claim 5 wherein an array of rows and columns of said cells is formed at said face, and the metal includes a plurality of parallel strips of metal, each strip forming the gates for a plurality of cells in a row.

7. A method according to claim 1 wherein said window is laterally spaced along the face away from both edges of said layer.

8. A method of making a semiconductor device comprising the steps of:
   applying a layer of conductive material over a face of a semiconductor body to form an electrode overlying a first semiconductor region,
   opening a window in layer over said first semiconductor region, and
   applying a conductive strip to said face over said layer but insulated therefrom, the strip extending into said window to form another electrode of the device.

9. A method according to claim 8 wherein the conductive material in polycrystalline silicon and a thin insulator separates said strip from the face in said window.

10. A method according to claim 9 wherein conductive strip is metal and the step of applying includes patterning the metal to define an elongated metallic strip forming a transistor gate at said window.

11. A method according to claim 10 wherein the step of patterning the metal includes leaving a plurality of elongated strips as row lines for an array of rows and columns of cells.

* * * * *